United States Patent
Bedell et al.

(10) Patent No.: US 8,936,961 B2
(45) Date of Patent: Jan. 20, 2015

(54) REMOVAL OF STRESSOR LAYER FROM A SPALLED LAYER AND METHOD OF MAKING A BIFACIAL SOLAR CELL USING THE SAME

(75) Inventors: Stephen W. Bedell, Wappinger Falls, NY (US); Keith E. Fogel, Hopewell Junction, NY (US); Bahman Hekmatshoartabari, White Plains, NY (US); Paul A. Lauro, Brewster, NY (US); Ning Li, White Plains, NY (US); Devendra K. Sadana, Pleasantville, NY (US); Ghavam G. Shahidi, Round Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 13/481,795

(22) Filed: May 26, 2012

(65) Prior Publication Data

US 2013/0316488 A1  Nov. 28, 2013

(51) Int. Cl.
*H01L 21/00* (2006.01)

(52) U.S. Cl.
USPC .......................................................... 438/68

(58) Field of Classification Search
USPC .......................................................... 438/68
See application file for complete search history.

(56) References Cited

U.S. PATENT DOCUMENTS

| | | | |
|---|---|---|---|
| 4,289,920 A | 9/1981 | Hovel | |
| 5,391,896 A | 2/1995 | Wanlass | |
| 7,056,808 B2 * | 6/2006 | Henley et al. | 438/458 |
| 7,622,363 B2 | 11/2009 | Yonehara | |
| 7,863,157 B2 * | 1/2011 | Henley et al. | 438/459 |
| 8,173,452 B1 * | 5/2012 | Petti et al. | 438/19 |
| 8,247,261 B2 * | 8/2012 | Bedell et al. | 438/73 |
| 2003/0203547 A1 * | 10/2003 | Sakaguchi et al. | 438/151 |
| 2007/0254456 A1 | 11/2007 | Maruyama | |
| 2010/0307572 A1 * | 12/2010 | Bedell et al. | 136/255 |
| 2010/0311250 A1 * | 12/2010 | Bedell et al. | 438/759 |
| 2011/0048516 A1 * | 3/2011 | Bedell et al. | 136/255 |
| 2011/0048517 A1 * | 3/2011 | Bedell et al. | 136/255 |
| 2011/0303273 A1 * | 12/2011 | Harper | 136/255 |

(Continued)

OTHER PUBLICATIONS

International Search Authority, Notification of ISR and Written opinion on PCT/US/2013/042772, Feb. 7, 2014.

(Continued)

*Primary Examiner* — Yu-Hsi D Sun
*Assistant Examiner* — Grant Withers
(74) *Attorney, Agent, or Firm* — Louis J. Percello; Otterstedt, Ellenbogen & Kammer, LLP

(57) ABSTRACT

A stressor layer used in a controlled spalling method is removed through the use of a cleave layer that can be fractured or dissolved. The cleave layer is formed between a host semiconductor substrate and the metal stressor layer. A controlled spalling process separates a relatively thin residual host substrate layer from the host substrate. Following attachment of a handle substrate to the residual substrate layer or other layers subsequently formed thereon, the cleave layer is dissolved or otherwise compromised to facilitate removal of the stressor layer. Such removal allows the fabrication of a bifacial solar cell.

25 Claims, 5 Drawing Sheets

(56) References Cited

U.S. PATENT DOCUMENTS

| | | | |
|---|---|---|---|
| 2012/0217622 A1* | 8/2012 | Bedell et al. | 257/632 |
| 2012/0322230 A1* | 12/2012 | Bedell et al. | 438/460 |
| 2013/0000707 A1* | 1/2013 | Bedell et al. | 136/255 |
| 2013/0139871 A1* | 6/2013 | Hirata et al. | 136/251 |
| 2013/0199611 A1* | 8/2013 | Murali et al. | 136/258 |
| 2013/0309791 A1* | 11/2013 | Bedell et al. | 438/28 |
| 2013/0316488 A1* | 11/2013 | Bedell et al. | 438/68 |
| 2014/0048122 A1* | 2/2014 | Fogel et al. | 136/249 |
| 2014/0057385 A1* | 2/2014 | Bedell et al. | 438/72 |

OTHER PUBLICATIONS

Sinha, A.K, et al.; Thermal stresses and cracking resistance of dielectric films (SiN, Si3N4, and SiO2) on Si substrates; J.Appl. Phys, vol. 49, No. 4, Apr. 1978; pp. 2423-2426.

Material Expansion Coefficients; 2002; Agilent Technologies Laser and Optics User's Manual; pp. 17-1-17-12.

Stephen W. Bedell et al., unpublished U.S. Appl. No. 13/472,584, filed May 16, 2012, Semiconductor Active Matrix on Buried Insulator.

* cited by examiner

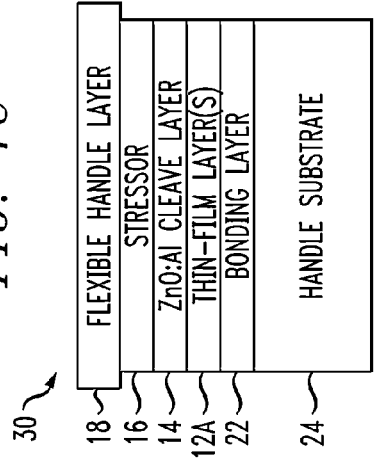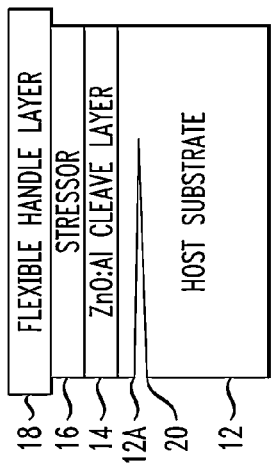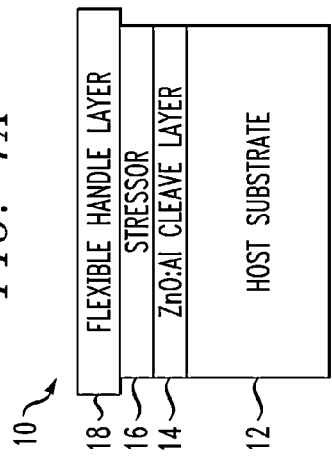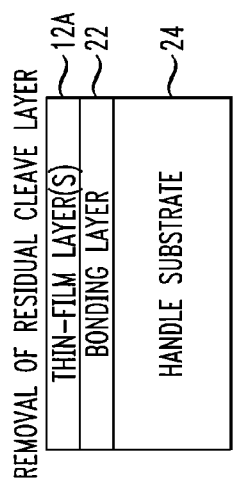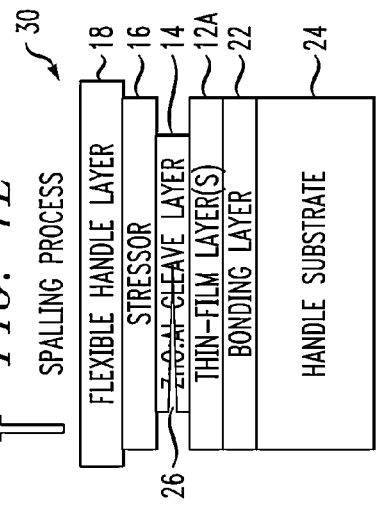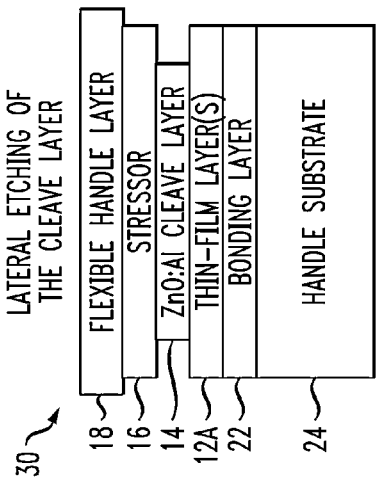

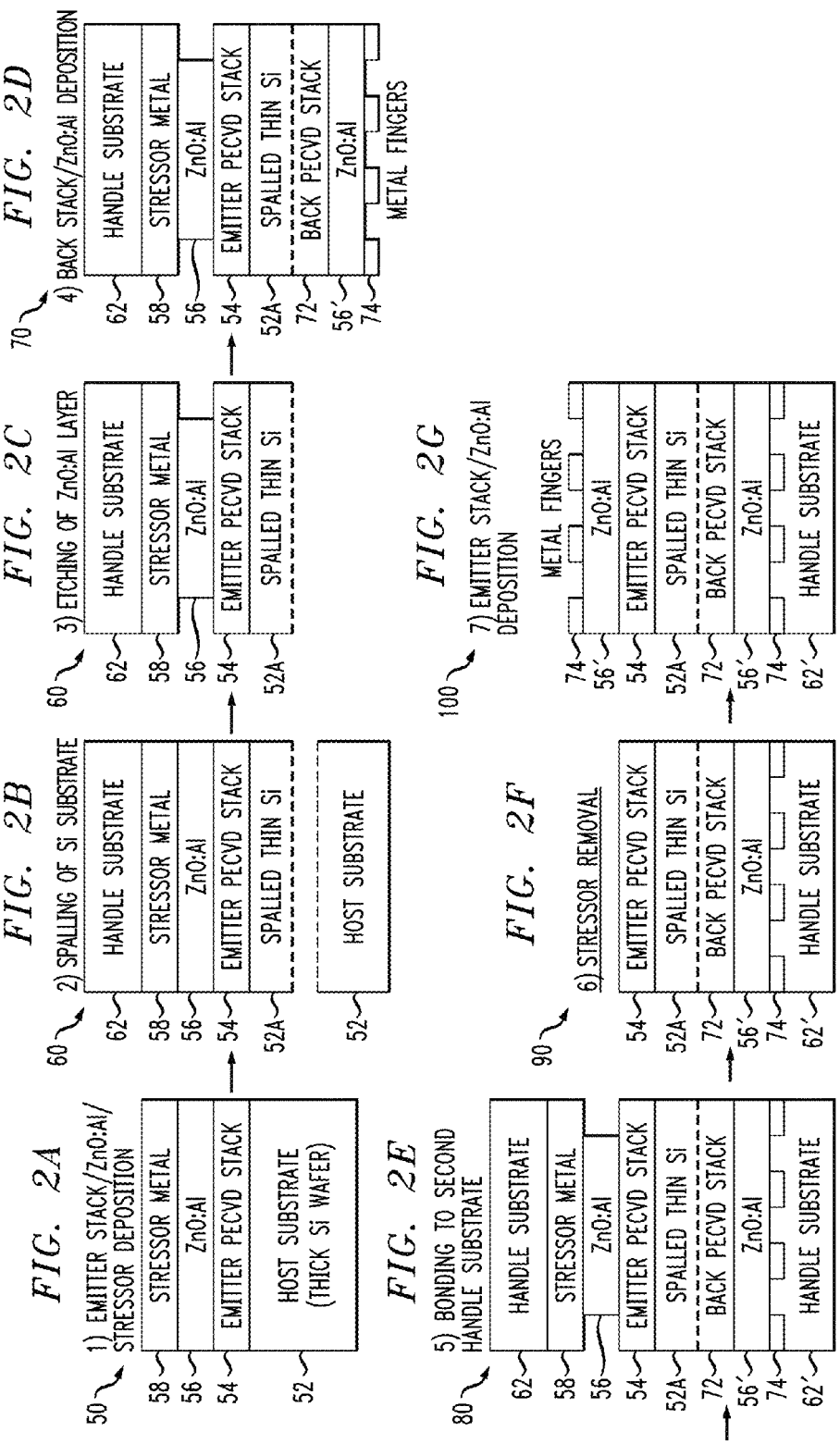

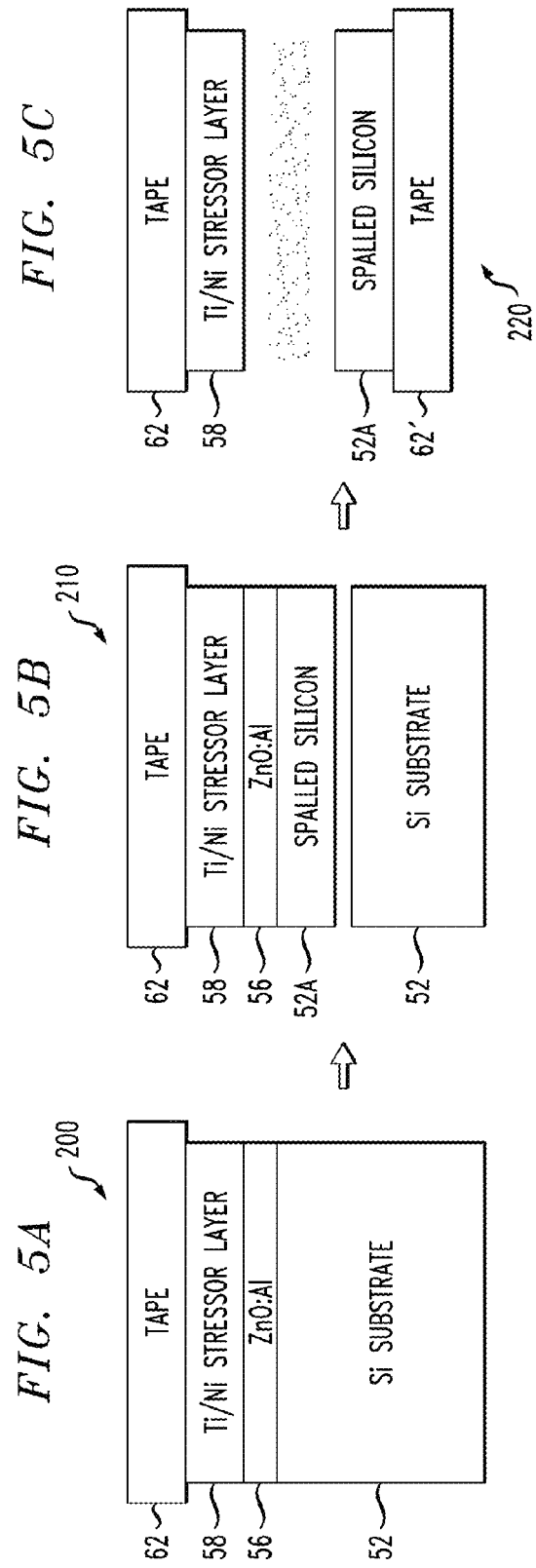

REMOVAL OF STRESSOR LAYER FROM A SPALLED LAYER AND METHOD OF MAKING A BIFACIAL SOLAR CELL USING THE SAME

FIELD

The present disclosure relates to the physical sciences and, more particularly, to controlled spalling techniques and devices such as bifacial solar cells that can be fabricated using such techniques.

BACKGROUND

Controlled spalling technology can be employed to remove thin substrate (e.g. silicon) film from a relatively thick substrate, enabling a wide range of applications including low cost solar cells and thin film flexible electronic devices and structures. The metal stressor layer used in spalling procedures also acts as a supporting layer to assist with handling of the spalled thin film, making thin semiconductor film handling much easier and more reliable. It is necessary, however, to remove the metal stressor layer in some applications, for example to obtain free standing semiconductor thin film to be compatible with high temperature device processing or to expose the original semiconductor substrate surface which is in contact with the metal stressor layer after spalling. Attempts have been made to remove the metal stressor layer using wet and/or dry chemical etching. Non-uniformity in etch rate while employing wet chemical etching through a thick nickel stressor layer may induce cracks in the spalled film. Additionally, complete removal of the thick nickel layer using wet/dry etching may be time consuming, lowering throughput.

BRIEF SUMMARY

In accordance with the principles discussed herein, fabrication methods are disclosed for fabricating semiconductor devices such as photovoltaic structures.

A method provided herein comprises obtaining a first structure including a host substrate comprising a semiconductor material, a flexible handle substrate, a stressor layer, and a cleave layer, the cleave layer being positioned between the host substrate and the stressor layer, and the stressor layer being positioned between the cleave layer and the flexible handle substrate. The method further includes separating a portion of the semiconductor from the host substrate via controlled spalling. A second structure comprising the flexible handle substrate, the stressor layer, the cleave layer and a residual substrate layer are spalled from the substrate. The method further includes compromising the cleave layer and removing the stressor layer from the second structure.

A further method comprises obtaining a first structure including a host substrate comprising a semiconductor material, a first junction on a first side of the host substrate, a cleave layer positioned over the first junction, a stressor layer over the cleave layer, and a flexible handle substrate, the stressor layer being positioned between the cleave layer and the flexible handle substrate. The method further includes spalling the host substrate to separate a residual substrate layer from the host substrate, forming at least one of a second junction and a metal contact on a side of the residual substrate layer opposite from the first junction, attaching a second handle substrate on a side of the residual substrate layer opposite from the flexible handle substrate, compromising the cleave layer, and removing the stressor layer.

A further method comprises obtaining a first structure comprising: a substrate layer comprised of a semiconductor material, a flexible handle substrate on a first side of the substrate layer, a stressor layer between the substrate layer and the flexible handle substrate, a cleave layer between the substrate layer and the stressor layer, and a second handle substrate on a second side of the substrate layer opposite from the flexible handle substrate. The method further includes compromising the cleave layer and removing the stressor layer.

A further method provided herein includes fabricating a first structure by: forming a cleave layer over a semiconductor host substrate, forming a metal stressor layer over the cleave layer, and forming a flexible handle substrate over the metal stressor layer. The method further includes spalling through the host substrate of the first structure, thereby forming a second structure including the flexible handle substrate, the metal stressor layer, the cleave layer, and a residual substrate layer from the host substrate. The method further includes attaching a second handle substrate to the second structure on a side of the residual substrate layer opposite from the metal stressor layer.

An exemplary flexible bifacial solar cell structure in accordance with certain aspects of the disclosure includes a semiconductor substrate having a thickness less than fifty microns, an emitter junction formed on a first side of the semiconductor substrate, a back junction formed on a second side of the semiconductor substrate, a transparent conductive layer electrically associated with each junction, a metal contact layer electrically associated with each transparent conductive layer, and a transparent handle substrate adjoining one of the metal contact layers.

A second exemplary structure comprises a semiconductor substrate, a flexible handle substrate on a first side of the semiconductor substrate, a second handle substrate on a second side of the semiconductor substrate, a stressor layer between the semiconductor substrate and the flexible handle substrate, and an etchable or dissolvable cleave layer positioned between the stressor layer and the semiconductor substrate. Further embodiments of the second exemplary structure include one or more additional features, such as the cleave layer having a lower fracture toughness value ($K_{Ic}$) than that of the material comprising the semiconductor substrate, emitter and/or back junctions on the semiconductor substrate, a metal stressor layer, a transparent second handle substrate, a semiconductor substrate thickness of less than fifty microns, and a laterally etched cleave layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided by the exemplary structures and methods disclosed herein. For example, one or more embodiments may provide one or more of the following advantages:
  Simplifying the post-spalling device fabrication process;
  Mechanical flexibility of fabricated device;
  Possible reuse of host semiconductor substrate;
  Bifacial solar cell operation.

These and other features and advantages of the disclosed methods and structures will become apparent from the following detailed description of illustrative embodiments thereof, which is to be read in connection with the accompanying drawings.

BRIEF DESCRIPTION OF THE DRAWINGS

FIGS. 1A-F show a flow diagram of a fabrication method in accordance with a first exemplary embodiment;

FIGS. 2A-G show a flow diagram of a method of fabricating a photovoltaic structure in accordance with a second exemplary embodiment;

DETAILED DESCRIPTION

Figure 3:
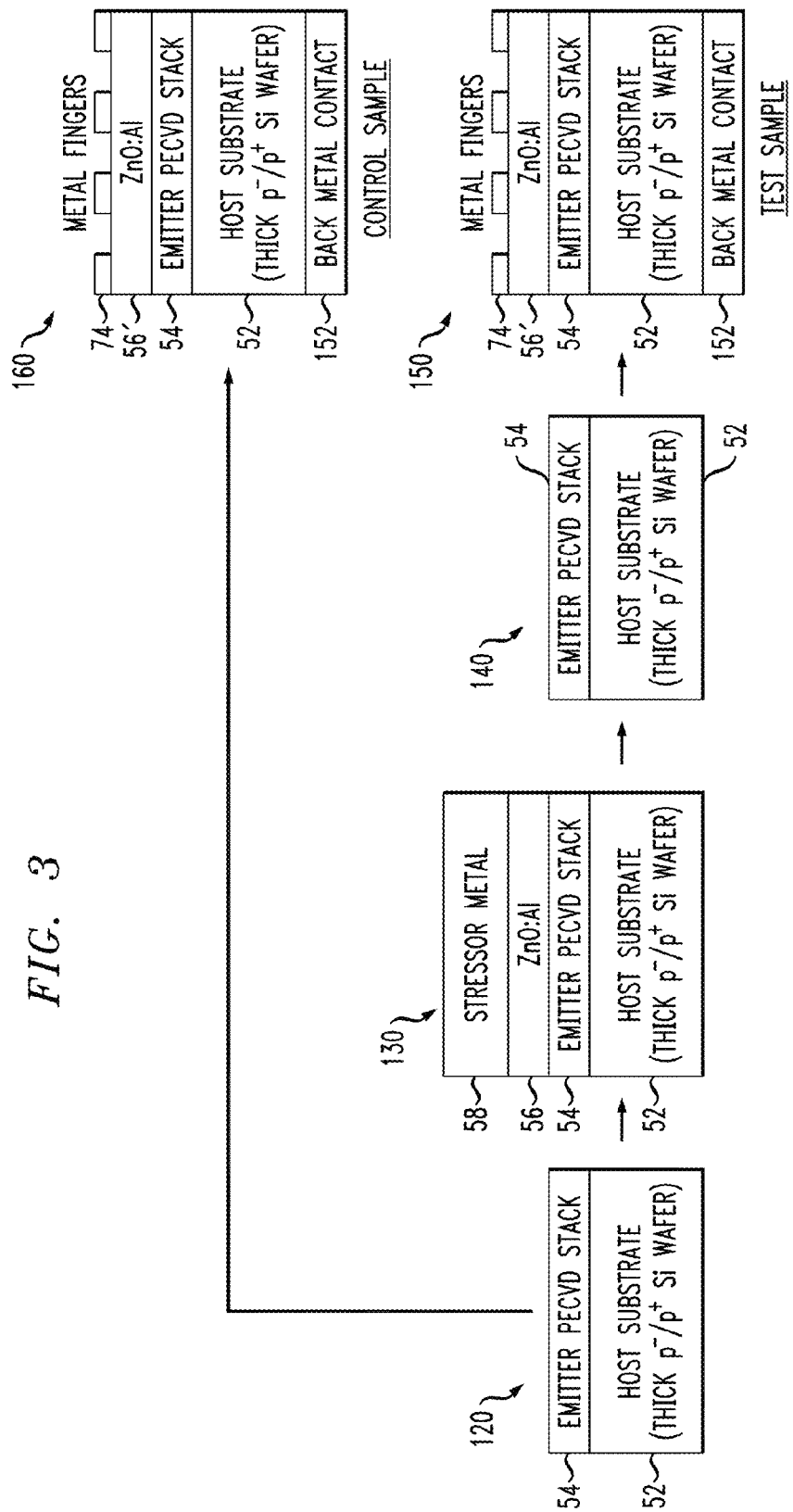
FIG. 3 shows alternative flow diagrams of alternative fabrication steps for making a photovoltaic structure.

Methods of removing a stressor layer from spalled material using a cleave layer are disclosed. The fabrication of bifacial solar cells using such methods is further disclosed.

A method in accordance with a first exemplary embodiment is comprised of the following steps (i) growing or depositing a material (hereafter referred to as a cleave layer) comprised of a material (e.g. ZnO:Al (AZO), indium tin oxide (ITO), silicon nitride (SiN) or silicon dioxide (SiO2)) having a lower fracture toughness value ($K_{Ic}$) than that of the host substrate material (in this exemplary embodiment Si) (ii) partial lateral etching of the cleave layer, and (iii) spalling through the cleave layer to detach the stressor layer and the handle layer used for spalling. The stressor layer is preferably though not necessarily a metal layer such as nickel or titanium. Such a method is illustrated schematically in FIG. 1.

Referring to FIG. 1A, first structure 10 is formed by (i) growing or depositing the cleave layer 14 on the host substrate 12, (ii) growing or depositing a metal stressor layer 16 on top of the cleave layer, and (iii) bonding the substrate to a flexible handle layer 18 on the metal stressor layer side. Referring to FIG. 1B, a thin layer 12A of the host substrate material 12 is spalled using a controlled spalling process, such as disclosed in U.S. Pub. No. 2010/0307572, which is incorporated by reference herein. The characteristics of the metal stressor layer 16 such as thickness and stress and the flexible handle layer 18 are adjusted to create a fracture 20 in the host substrate 12 that ultimately separates the flexible handle layer, metal stressor layer, cleave layer and the thin residual layer 12A from the host substrate. The spalled substrate layer 12A is then bonded to a second handle substrate 24, which may or may not be flexible, on the spalled side. The second handle substrate 24 has sufficient thickness to facilitate handling of the structure to which it is affixed during and/or following device fabrication. As shown in FIG. 1C, the resulting structure 30 includes the flexible handle layer 18, the metal stressor layer 16, the cleave layer 14, the residual layer 12A, a bonding layer 22, and the second handle substrate 24. It will be appreciated that one or more additional thin film layers (not shown) may be formed on the thin residual layer 12A prior to bonding the second handle substrate. It will further be appreciated that the host substrate 12 may either be monolithic or include a plurality of layers.

Referring to FIG. 1D, partial lateral etching of the cleave layer 14 is effected by exposing the structure 30 to a chemical etch including but not limited to a hydrogen fluoride (HF) or hydrogen chloride (HCL) containing solution. Applying shear stress using the flexible handle substrate 18, the stressor layer 16 and the flexible handle substrate 18 are detached by forming a fracture 26 in and spalling through the cleave layer 14 as shown in FIG. 1E. (The terms flexible handle layer and flexible handle substrate are used interchangeably.) Applying shear stress to the handle substrate to detach the flexible handle substrate and the stressor is typically performed outside the etch solution; however, it is possible to perform this step inside the etch solution as well. Residual cleave layer material remaining on the residual (e.g. silicon) layer(s) is removed in this exemplary embodiment using the same solution employed to effect partial lateral etching of the cleave layer 14. A different etch solution may be used as well, if desired.

Methods as disclosed herein are applicable to the fabrication of thin film devices including photovoltaic devices. The methods are amenable to wafer scale applications. As known in the art, a photovoltaic device (solar cell) is comprised of at least one junction, i.e. the emitter (front) junction. The emitter junction is comprised of at least one semiconductor material having the opposite conductivity as that of the substrate. The emitter may be formed using various techniques known in the art, such as diffusion, implantation, deposition/growth of the emitter layer(s), and combinations thereof. A photovoltaic device may also optionally, but preferably, include a second junction, on the second (back) side of the substrate, comprised of at least one semiconductor material having the same conductivity type as that of the substrate. Similarly, the back junction may be formed by various techniques known in the art, such as diffusion, implantation, growth/deposition of layers, and combinations thereof. Fabrication of a solar cell device according to the methods disclosed herein offers the advantage of reusing the substrate material, mechanical flexibility of the solar cell, bifacial operation of the solar cell, or combinations thereof.

Solar cell fabrication according to an exemplary embodiment of the disclosed methods includes the following steps: (i) forming a first junction on the a first side of the substrate, (ii) forming a cleave layer above the first junction, (iii) forming a metal stressor layer above the cleave layer, (iv) bonding a flexible handle substrate on the metal stressor layer side of the substrate, (v) spalling the substrate using the flexible handle substrate, forming a residual substrate layer, (vi) forming a second junction (or solely a metal contact) on a second (spalled) side of the substrate, (vii) bonding the substrate onto a second handle substrate (which may or may not be flexible) on the second (spalled) side of the substrate, (viii) compromising the cleave layer as disclosed herein (e.g. by partial lateral etching or dissolution of the cleave layer), and (ix) removing the first handle substrate and the stressor layer from the first side of the substrate (e.g. by spalling through the cleave layer if partially compromised or simple displacement of the stressor metal layer with respect to the residual substrate layer if the cleave layer is entirely compromised. Depending on the type of solar cell technology being used, further processing steps as known in the art, may follow or be included in between these steps as necessary. If the second handle substrate is optically transparent, the solar cell may be operated in bifacial mode.

An exemplary process in illustrated schematically for a Si heterojunction solar cell comprised of front and back PECVD stacks in FIGS. 2A-G. The order of the formation of the front and back PECVD stacks may be reversed. Materials other than Al-doped zinc-oxide (ZnO:Al) may be used to form the cleave layer. Examples include but are not limited to indium-tin-oxide (ITO), silicon nitride and silicon dioxide. In the case of ZnO:Al and ITO, the lateral etch of the cleave layer may be performed in an HF containing or an HCl containing solution. An HF containing solution may be used in the case of nitride or oxide cleave layers as well. The residual cleave layer after stressor layer removal may be removed using the same etch solution if desired, prior to subsequent processing steps. The exemplary process may be performed by dissolving the cleave layer rather than lateral etching followed by spalling, as described below with reference to FIG. 5.

Referring to FIG. 2A, a first structure 50 includes a host substrate, which is a thick silicon wafer in this exemplary embodiment. An emitter stack 54 is formed on the host substrate by plasma-enhanced chemical vapor deposition (PECVD) and comprises a first junction. A cleave layer 56 is formed over the emitter stack. As discussed above, the cleave layer 56 has a lower fracture toughness value ($K_{Ic}$) than that of the host substrate material in embodiments where the cleave layer is to be spalled. A stressor metal layer 58 is formed over the cleave layer. The stressor metal layer may comprise nickel and be about 5-6 microns in thickness in some embodiments. A flexible handle substrate 62 is attached to the metal stressor layer side of the substrate 52 as shown in FIG. 2B. The flexible handle substrate comprises a polyimide material in some embodiments, such as Kapton tape. The flexible handle substrate is employed as a mechanical handle for controlled spalling of the host substrate 52. The spalling process results in the separation of the stacked structure 60 shown in FIG. 2B from the host substrate. The residual silicon layer 52A in the stacked structure 60 has a thickness of fifty microns or less in some embodiments, and is preferred for forming a flexible, bifacial solar cell.

As shown in FIG. 2C, the structure 60 is subjected to an etching solution to compromise the integrity of the cleave layer in this exemplary embodiment. The cleave layer is laterally etched, thereby weakening it, and facilitating crack initiation in the cleave layer.

A back stack 72 is formed on the residual silicon layer 52A by PECVD in this exemplary embodiment, and comprises a second junction. (As discussed above, the first and second junctions can be formed in either order.) A transparent conductive layer 56' is formed on the back stack 72. The transparent conductive layer may be a transparent conductive oxide such as ZnO:Al, like the cleave layer 56. It will be appreciated that the transparent conductive layer and the cleave layers may be comprised of the same or different materials. They may accordingly have the same or different etch characteristics. A metal layer comprising metal fingers 74 is formed on the transparent conductive layer to complete the structure 70 shown in FIG. 2D. It will be appreciated that the etching step may be performed either prior to or after formation of the transparent conductive layer. If the cleave layer and transparent conductive layer are both comprised of etchable materials, they will both be etched laterally. However, since the cleave layer 56 is closest to the flexible handle substrate 62, the spalling would still occur through the cleave layer as described below with reference to FIG. 2F.

A second handle substrate 62' is bonded to the structure 70 to form the structure 80 shown in FIG. 2E. The second handle substrate is attached to the side opposite the residual silicon layer 52A from the flexible handle substrate. As discussed above, the second handle substrate 62' may or may not be flexible. It can be comprised of plastic, glass, metal or other materials that facilitate handling of the structure 80 and other subsequently formed structures. The flexible handle substrate exerts a force on the weakened cleave layer 56 through the metal stressor layer 58, separating the flexible handle substrate and stressor metal layer by spalling. This step results in the structure 90 shown in FIG. 2F. As discussed above, any residual cleave layer remaining on the structure 90 may be removed by etching. A second transparent conductive layer 56' is deposited on the emitter stack 54 followed by formation of metal fingers 74 on this layer. The bifacial heterojunction photovoltaic structure 100 shown in FIG. 2G is thereby provided.

Figure 4:
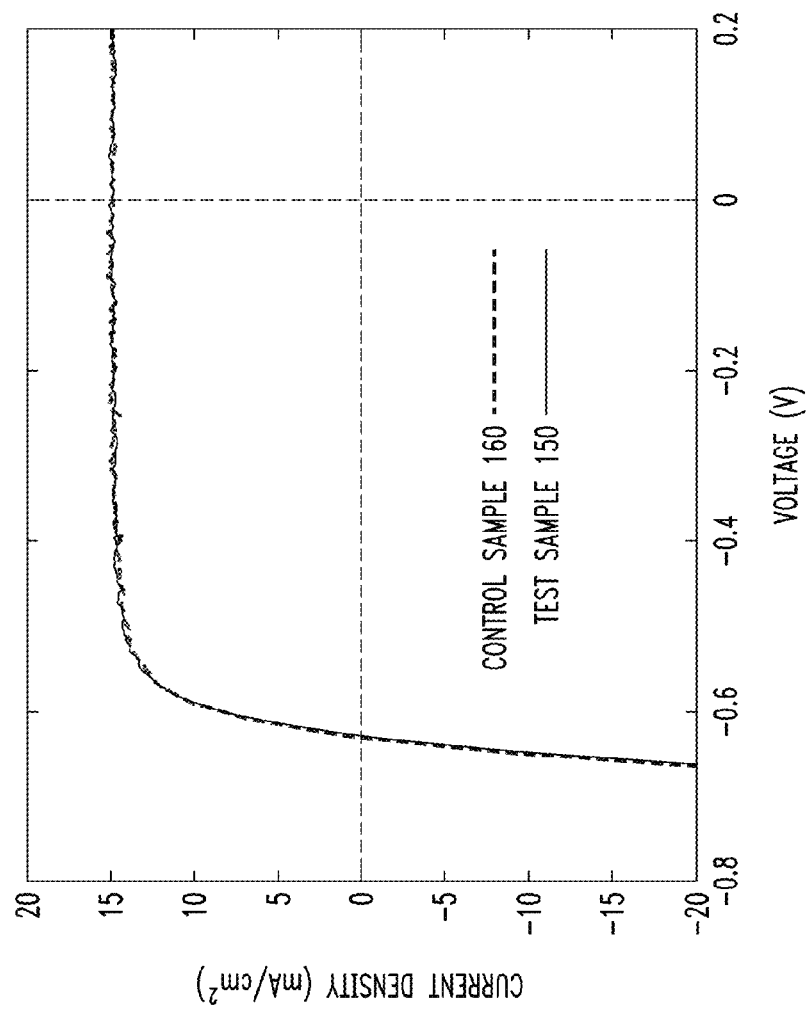
FIG. 4 is an I-V chart showing test results for the structures obtained using the alternative fabrication steps of FIG. 3, and FIGS. 5A-C show a flow diagram of a fabrication method in accordance with a third exemplary embodiment.

A proof-of-concept experiment is illustrated in FIG. 3. A PECVD emitter stack 54 comprised of $n^+$ doped Si layers was deposited on commercially available $p^-/p^+$ Si substrates 52. The substrate 52 was then divided into two pieces. The first piece (control sample) was processed to form the ZnO:Al doped electrode 56', the top metal grid 74 (fingers) and a bottom metal contact 152, forming the photovoltaic structure 160. On the second piece (test sample), a ZnO:Al layer was deposited as a cleave layer 56, followed by the deposition of the stressor metal layer 58. The stressor metal layer was then removed by lateral etching in dilute HF solution followed by spalling through the ZnO:Al cleave layer 56 as disclosed herein. The residual ZnO:Al layer was subsequently removed in the dilute HF solution. The ZnO:Al electrode 56', front metal grid 74, and the back contact metal 152 were then formed on this sample, forming a second photovoltaic structure 150. (The electrode/metal grid/back metal deposition steps were performed simultaneously on this test sample and the control sample described above, to eliminate possible run-to-run process variations.) The experimental light I-V characteristics of the test sample 150 and the control sample 160 are nearly identical as shown in FIG. 4. It is accordingly evident that the disclosed method does not compromise the performance of the resulting solar cell device.

FIGS. 5A-5C schematically illustrate an alternative process for separating the metal stressor layer 58 from a residual substrate layer 52A following spalling. As shown in FIG. 5A, an exemplary structure 200 includes a silicon host substrate 52, a ZnO:Al cleave layer 56, a metal (e.g. titanium or nickel) stressor layer 58, and a flexible tape 62. Mechanical strain induced via the flexible tape 62 causes the structure 210 above a fracture formed in the substrate 52 to be spalled from the substrate, as shown in FIG. 5B. A second handle substrate 62' is attached to the structure 210. The cleave layer 56 is then dissolved in solution as shown in FIG. 5C. This is in contrast to being laterally etched and then spalled as shown in FIGS. 1 and 2. Once the adhesion of the cleave layer 56 to the adjoining layers has been adequately compromised, a structure 220 comprising the residual silicon layer 52A and tape separates from the metal stressor layer 58. An emitter stack and/or other thin film layers can then be formed on the residual silicon layer 52A, which is supported by the second handle substrate 62' (e.g. a tape). The principles of this process can be incorporated within the processes of FIGS. 1 and 2. The cleave layer 56 in this exemplary process should: i) be sufficiently rigid to transfer stress from the stressor metal layer to the substrate 52, ii) have strong adhesion to both the stressor metal layer and the host substrate or other layer which it adjoins, and iii) be quickly dissolvable in solution to effect quick release of the metal stressor layer. As discussed above, zinc oxide can be dissolved in an acid solution containing HCl or HF. It can alternatively be dissolved in hot acetone. It will be appreciated that the term "cleave" as used to describe the cleave layer 56 this exemplary embodiment does not suggest that this layer will be split or fractured rather than dissolved. Mechanical agitation (e.g. ultrasonic) of the structure 210 may be employed to facilitate the dissolution of the cleave layer.

Given the discussion thus far, a method is provided that includes obtaining a first structure including a host substrate comprising a semiconductor material, a flexible handle substrate, a stressor layer, and a cleave layer, the cleave layer being positioned between the host substrate and the stressor layer, the stressor layer being positioned between the cleave layer and the flexible handle substrate. Such a first structure is shown by the exemplary structure 10 in FIG. 1A. The method further includes separating a portion of the semiconductor material from the host substrate using controlled spalling. FIG. 1B shows the formation of a fracture 20 in the host substrate using the flexible handle substrate 18 during part of a controlled spalling process. The host substrate is spalled, thereby forming a second structure including the flexible handle substrate, the stressor layer, the cleave layer, and a residual substrate layer from the host substrate. Such a structure is also shown in FIG. 1B above the fracture 20. The method further includes compromising the cleave layer and removing the stressor layer from the second structure. FIG. 1D shows the compromising of the cleave layer by lateral etching, though as discussed above it could be compromised by dissolution in this or other embodiments. Removal of the stressor layer 16 through spalling is shown in FIG. 1E. The flow diagrams of FIGS. 2A-2F and 5A-5C and accompanying discussion above are also germane to this method.

A method in accordance with a further exemplary embodiment comprises obtaining a first structure including a host substrate comprising a semiconductor material, a first junction on a first side of the host substrate, a cleave layer positioned over the first junction, a stressor layer over the cleave layer, and a flexible handle substrate, the stressor layer being positioned between the cleave layer and the flexible handle substrate. FIG. 2A shows such an exemplary structure prior to attaching the flexible handle substrate, which is shown in FIG. 2B. The method further includes spalling the host substrate to separate a residual substrate layer from the host substrate. FIG. 2B shows the spalling of the host substrate, as further described above. At least one of a second junction and a metal contact is formed on a side of the residual substrate layer opposite from the first junction, such as the second junction 72 shown in FIG. 2D. The method further includes attaching a second handle substrate on a side of the residual substrate layer opposite from the flexible handle substrate. FIG. 2E shows the attachment of a second handle substrate 62' on a side of the residual substrate layer 52A opposite from the flexible handle substrate 62. The method further includes compromising the cleave layer and removing the stressor layer. FIG. 2C shows the lateral etching of the cleave layer 56, which is thereby compromised. Stressor layer removal is shown in FIG. 2F.

A further exemplary method includes obtaining a first structure comprising a substrate layer comprised of a semiconductor material, a flexible handle substrate on a first side of the substrate layer, a stressor layer between the substrate layer and the flexible handle substrate, a cleave layer between the substrate layer and the stressor layer, and a second handle substrate on a second side of the substrate layer opposite from the flexible handle substrate. FIGS. 1C and 2E both show such a structure. Referring to FIG. 1C, a semiconductor substrate 12A for this structure 30 is obtained through spalling of the host substrate 12. A flexible handle substrate 18 is on a first side of the substrate layer 12A and a stressor layer 16 is between the substrate layer 12A and flexible handle substrate 18. The cleave layer 14 is between the substrate layer 12A and the stressor layer 16. The method further includes compromising the cleave layer, which is shown in FIG. 1D and removing the stressor layer. Stressor layer removal in the embodiment of FIG. 1E is accomplished by spalling through the cleave layer. As discussed with respect to FIGS. 5A-C, the cleave layer may instead by compromised through dissolution followed by removal of the stressor layer.

A further exemplary method includes fabricating a first structure by: forming a cleave layer over a semiconductor host substrate, forming a metal stressor layer over the cleave layer, and forming a flexible handle substrate over the metal stressor layer. A first structure 10 fabricated in accordance with the method is shown in FIG. 1A. The method further includes spalling through the host substrate of the first structure, thereby forming a second structure including the flexible handle substrate, the metal stressor layer, the cleave layer, and a residual substrate layer from the host substrate. FIG. 1B shows the step of spalling through the host substrate 12 to form a second structure including the flexible handle substrate 18, the stressor layer 16, the cleave layer 14 and a residual substrate layer 12A. A second handle substrate is attached to the second structure on a side of the residual substrate layer opposite from the metal stressor layer, as exemplified by FIG. 1C which shows the attachment of a second handle substrate 24. FIGS. 2A, 2B and 2E likewise show the fabrication of such a first structure, followed by spalling of the host substrate 52 to form a second structure 60 and the attachment of a second handle substrate 62'.

A structure is provided in accordance with a further aspect that comprises a semiconductor substrate, a flexible handle substrate on a first side of the semiconductor substrate, and a second handle substrate on a second side of the semiconductor substrate. FIG. 1D shows one exemplary embodiment including a semiconductor substrate (residual layer 12A), a flexible handle substrate 18 and a second handle substrate 24. FIG. 2E shows a second exemplary structure 80 including these elements. The structure further includes a stressor layer between the semiconductor substrate and the flexible handle substrate. An etchable or dissolvable cleave layer is between the metal stressor layer and the semiconductor substrate. The cleave layer is selected to have a lower fracture toughness value ($K_{Ic}$) than that of the material comprising the semiconductor substrate if it is to be spalled rather than dissolved. Stressor layers and cleave layers are shown, respectively, in the structures 30 and 80 illustrated in FIGS. 1D and 2E. In one or more embodiments of the structure, a first junction layer is provided on a side of the semiconductor substrate, such as the emitter layer 54 shown in FIG. 2E. In one or more further embodiments of the structure, a second junction layer is provided on a second side of the semiconductor substrate, such as the back junction layer 72 shown in FIG. 2E. In one or more embodiments of the structure, the stressor layer is a metal layer. The second handle substrate is transparent in one or more embodiments of the structure. The cleave layer is laterally etched in one or more embodiments of the exemplary structure, such as shown in FIGS. 1D and 2E. In one or more embodiments of the exemplary structure, the thickness of the semiconductor substrate is less than fifty microns. The semiconductor substrate comprises silicon in one or more embodiments.

A flexible, bifacial solar cell is further provided in accordance with the present disclosure. Referring to FIG. 2G, the solar cell 100 includes a semiconductor substrate having a thickness less than fifty microns. The residual silicon layer 52A shown in FIG. 2G has such a thickness in this exemplary embodiment, which provides for device flexibility. A first junction such as an emitter layer is formed on a first side of the semiconductor substrate and a second (e.g. back) junction is formed on a second side of the semiconductor substrate. A transparent conductive layer is electrically associated with each junction and a metal contact layer is electrically associated with each transparent conductive layer. A transparent handle substrate such as the handle substrate 62' adjoins one of the metal contact layers. In one or more embodiments of the solar cell, the semiconductor substrate comprises silicon.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above" and "below" are generally employed to indicate relative positions as opposed to relative elevations unless otherwise indicated.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    obtaining a first structure including a host substrate comprising a semiconductor material, a flexible handle substrate, a stressor layer, and a cleave layer, the cleave layer being positioned between the host substrate and the stressor layer, the stressor layer being positioned between the cleave layer and the flexible handle substrate;
    separating a portion of the semiconductor material from the host substrate using controlled spalling, thereby forming a second structure including the flexible handle substrate, the stressor layer, the cleave layer, and a residual substrate layer from the host substrate;
    compromising the cleave layer, and
    removing the stressor layer from the second structure.

2. The method of claim 1, further including the step of attaching a second handle substrate to the second structure on a side of the residual substrate opposite from the stressor layer prior to separating the metal stressor layer from the residual substrate layer.

3. The method of claim 2, wherein the step of compromising the cleave layer includes laterally etching the cleave layer.

4. The method of claim 3, wherein the step of removing the stressor layer from the residual substrate layer includes spalling through the cleave layer.

5. The method of claim 2, wherein the step of compromising the cleave layer includes dissolving the cleave layer.

6. The method claim 2, wherein the first structure further includes a first junction for a photovoltaic structure between the cleave layer and the host substrate.

7. The method of claim 6, further including the step of forming a second junction for a photovoltaic structure on the residual substrate layer.

8. The method of claim 7, wherein one of the first and second junctions comprises an emitter junction.

9. The method of claim 8, wherein the residual substrate layer has a thickness of less than fifty microns.

10. The method of claim 9, wherein the host substrate comprises a silicon wafer and the stressor layer is comprised of metal.

11. A method comprising:
    obtaining a first structure including a host substrate comprising a semiconductor material, a first junction on a first side of the host substrate, a cleave layer positioned over the first junction, a stressor layer over the cleave layer, and a flexible handle substrate, the stressor layer being positioned between the cleave layer and the flexible handle substrate;
    spalling the host substrate to separate a residual substrate layer from the host substrate;
    forming at least one of a second junction and a metal contact on a side of the residual substrate layer opposite from the first junction;
    attaching a second handle substrate on a side of the residual substrate layer opposite from the flexible handle substrate;
    compromising the cleave layer, and
    removing the stressor layer.

12. The method of claim 11, wherein the step of compromising the cleave layer includes laterally etching the cleave layer.

13. The method of claim 12, wherein the step of removing the metal stressor layer from the residual substrate layer includes spalling through the cleave layer.

14. The method of claim 11, wherein the step of compromising the cleave layer includes dissolving the cleave layer.

15. The method of claim 11, further including forming both a second junction and a metal contact on the side of the residual substrate layer opposite from the first junction.

16. The method of claim 15, wherein one of the first and second junctions is an emitter junction having opposite conductivity type as the residual substrate layer and the other of the first and second junctions is a back junction comprising at least one semiconductor material having the same conductivity type as that of the residual substrate layer.

17. The method of claim 15, wherein the residual substrate layer has a thickness of less than fifty microns.

18. A method comprising:
    obtaining a first structure comprising:
        a substrate layer comprised of a semiconductor material,
        a flexible handle substrate on a first side of the substrate layer,
        a stressor layer between the substrate layer and the flexible handle substrate,
        a cleave layer between the substrate layer and the stressor layer, and
        a second handle substrate on a second side of the substrate layer opposite from the flexible handle substrate;
    compromising the cleave layer, and
    removing the stressor layer.

19. The method of claim 18, wherein the first structure further includes a first junction layer between the substrate layer and the cleave layer.

20. The method of claim 18, wherein the step of compromising the cleave layer includes laterally etching the cleave layer and the step of removing the metal stressor layer includes spalling the cleave layer.

21. The method of claim 18, wherein the step of compromising the cleave layer includes dissolving the cleave layer.

22. The method of claim 19, wherein the first structure further includes a second junction layer, the second junction layer being between the substrate layer and the second handle substrate, one of the first and second junction layers comprising an emitter junction.

23. A method comprising:
    fabricating a first structure by:
        forming a cleave layer over a semiconductor host substrate,
        forming a metal stressor layer over the cleave layer, and
        forming a flexible handle substrate over the metal stressor layer;
    spalling through the host substrate of the first structure, thereby forming a second structure including the flexible handle substrate, the metal stressor layer, the cleave layer, and a residual substrate layer from the host substrate, and
    attaching a second handle substrate to the second structure on a side of the residual substrate layer opposite from the metal stressor layer.

24. The method of claim 23, further including forming a first junction layer on the host substrate.

25. The method of claim 24, wherein the second handle substrate is transparent, and further including forming a second junction layer on the residual substrate layer.

\* \* \* \* \*